(12) United States Patent
Lee et al.

(10) Patent No.: US 12,740,430 B2
(45) Date of Patent: Sep. 15, 2026

(54) SEMICONDUCTOR DEVICE

(71) Applicant: United Microelectronics Corp., Hsinchu (TW)

(72) Inventors: Chien-Yi Lee, Hsinchu City (TW); Tse-Pu Chen, Tainan City (TW); Ming-Yang Peng, Hsinchu County (TW); Sheng-Huei Dai, Taitung County (TW)

(73) Assignee: United Microelectronics Corp., Hsinchu (TW)

( * ) Notice: Subject to any disclaimer, the term of this patent is extended or adjusted under 35 U.S.C. 154(b) by 359 days.

(21) Appl. No.: 18/629,910

(22) Filed: Apr. 8, 2024

(65) Prior Publication Data

US 2025/0293183 A1 Sep. 18, 2025

(30) Foreign Application Priority Data

Mar. 14, 2024 (TW) ................................ 113109377

(51) Int. Cl.

| | |
|---|---|
| ***H10W 44/00*** | (2026.01) |
| ***H10D 1/20*** | (2025.01) |
| ***H10W 20/41*** | (2026.01) |
| ***H10W 20/48*** | (2026.01) |
| ***H10W 90/00*** | (2026.01) |

(52) U.S. Cl.

CPC ............ *H10W 44/501* (2026.01); *H10D 1/20* (2025.01); *H10W 20/435* (2026.01); *H10W 20/48* (2026.01); *H10W 90/00* (2026.01)

(58) Field of Classification Search

CPC . H10W 44/501; H10W 20/435; H10W 20/48; H10W 90/00; H10W 20/497; H10D 1/20; H05K 9/0075

See application file for complete search history.

(56) References Cited

U.S. PATENT DOCUMENTS

| | | | | |
|---|---|---|---|---|
| 7,741,188 | B2 | 6/2010 | Dyer et al. | |
| 7,811,919 | B2 * | 10/2010 | Daley | H10D 84/206 257/E21.32 |
| 9,252,199 | B2 | 2/2016 | Yeh | |
| 2008/0020488 | A1 | 1/2008 | Clevenger et al. | |
| 2009/0243034 | A1 * | 10/2009 | Stribley | H10D 84/00 257/E29.325 |

(Continued)

OTHER PUBLICATIONS

Hsin-Lung Tu et al., "High Performance Spiral Inductor on Deep-Trench-Mesh Silicon Substrate", IEEE Microwave and Wireless Components Letters, vol. 16, Dec. 2006, pp. 654-656.

(Continued)

*Primary Examiner* — Syed I Gheyas
(74) *Attorney, Agent, or Firm* — JCIPRNET

(57) ABSTRACT

A semiconductor device includes a substrate, a shielding structure, and an inductor. The shielding structure is disposed in the substrate and includes a plurality of conductive filling layers and a plurality of high-k dielectric liner layers. The plurality of conductive filling layers are in a plurality of recesses of the substrate. The plurality of high-k dielectric liner layers are between the plurality of conductive filling layers and the substrate. The plurality of conductive filling layers are electrically connected to each other and grounded. The inductor is located above the shielding structure.

20 Claims, 15 Drawing Sheets

(56) References Cited

U.S. PATENT DOCUMENTS

| | | | | |
|---|---|---|---|---|
| 2012/0212316 | A1* | 8/2012 | Cho | H10D 1/20<br>336/200 |
| 2013/0044455 | A1* | 2/2013 | Cho | H10W 20/496<br>438/618 |
| 2015/0364532 | A1* | 12/2015 | Lin | H10D 1/20<br>257/531 |

OTHER PUBLICATIONS

Sidina Wane et al., "Full-Wave Analysis of Inhomogeneous Deep-Trench Isolation Patterning for Substrate Coupling Reduction and Q-Factor Improvement", IEEE Transactions on Microwave Theory and Techniques, Jul. 2006, pp. 1-15.

* cited by examiner

U3 {U3c, U3d}

SEMICONDUCTOR DEVICE

CROSS-REFERENCE TO RELATED APPLICATION

This application claims the priority benefit of Taiwan application serial no. 113109377, filed on Mar. 14, 2024. The entirety of the above-mentioned patent application is hereby incorporated by reference herein and made a part of specification.

BACKGROUND OF THE INVENTION

Field of the Invention

The invention relates to an integrated circuit, and in particular to a semiconductor device.

Description of Related Art

The inductor is a common passive device. When the inductor is in operation, the magnetic field in the inductor region readily generates eddy current, thus reducing the Q factor and as a result affecting the performance of the inductor.

SUMMARY OF THE INVENTION

The invention provides a semiconductor device that may cut off or reduce the eddy current generated by the magnetic field in the inductor region when the inductor is in operation to increase the Q factor and improve the performance of the inductor.

In an embodiment of the invention, a semiconductor device includes a substrate, a shielding structure, and an inductor.

The shielding structure is disposed in the substrate and includes a plurality of conductive filling layers and a plurality of high-k dielectric liner layers. The plurality of conductive filling layers are in a plurality of recesses of the substrate. The plurality of high-k dielectric liner layers are between the plurality of conductive filling layers and the substrate. The plurality of conductive filling layers are electrically connected to each other and grounded. The inductor is located above the shielding structure.

In an embodiment of the invention, a semiconductor device includes a substrate, a shielding structure, an inductor, and a dielectric layer. The shielding structure is disposed in the substrate. The shielding structure includes a plurality of high-k dielectric liner layers in a plurality of recesses of the substrate, and at least a portion of the plurality of high-k dielectric liner layers does not completely fill the plurality of recesses. The inductor is located above the shielding structure. The dielectric layer is located between the inductor and the shielding structure and filled in a plurality of remaining spaces of the plurality of recesses.

Based on the above, in an embodiment of the invention, the shielding structure disposed under the inductor may cut off or reduce the eddy current generated by the magnetic field in the inductor region when the inductor is in operation. Therefore, the Q factor may be increased and the performance of the inductor may be improved.

DESCRIPTION OF THE EMBODIMENTS

Figure 1A:
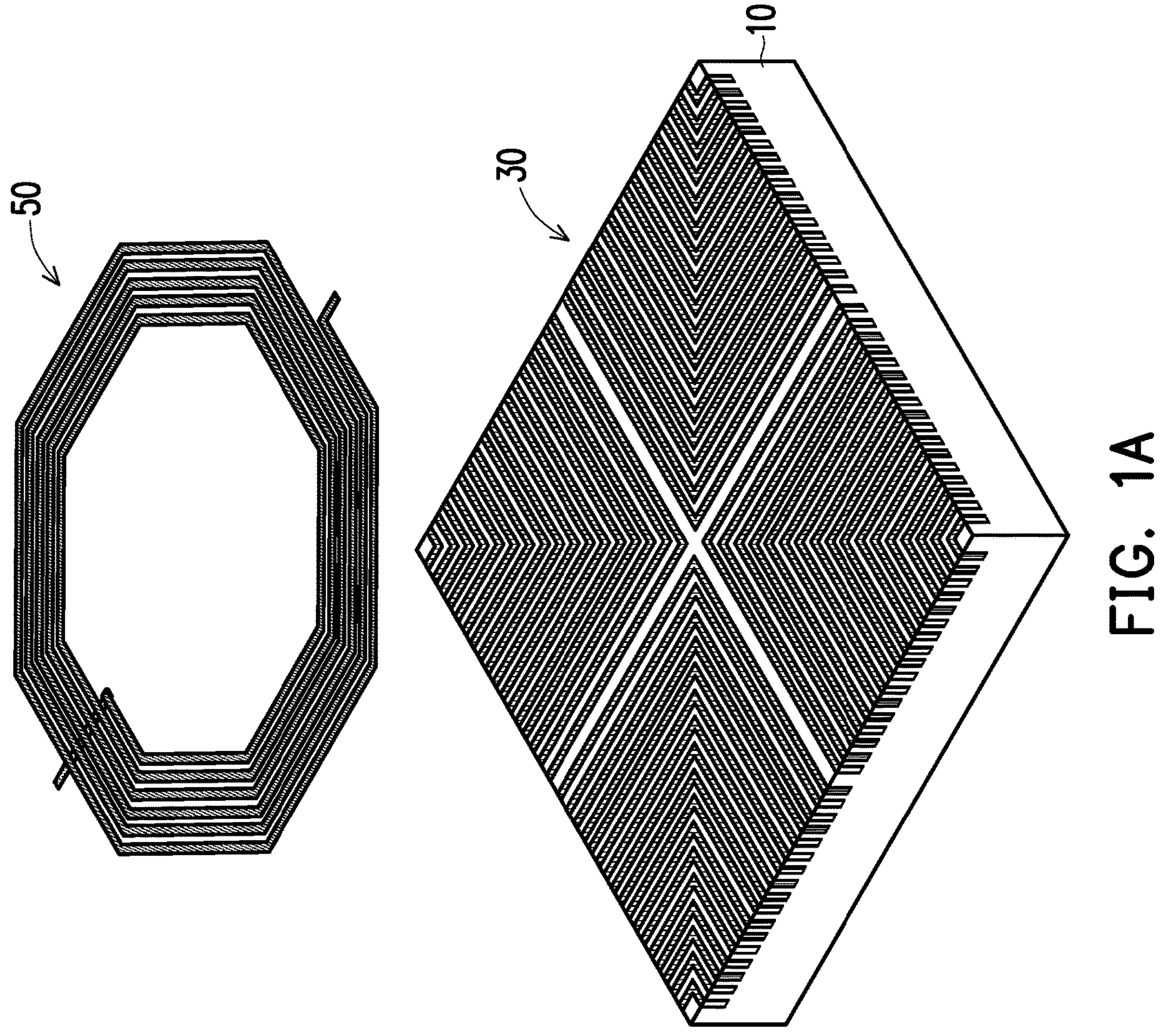
FIG. 1A shows a three-dimensional view of a semiconductor device of an embodiment of the invention.

Referring to FIG. 1A, a semiconductor device of an embodiment of the invention includes an inductor 50. The inductor 50 may be a spiral inductor. The inductor 50 may be used as a radio frequency (RF) inductor. When the inductor 50 is in operation, the magnetic field in the inductor region generates an eddy current, causing the Q factor to decrease. The Q factor is an important parameter for the RF inductor that defines the performance thereof. A decrease in the Q factor causes the performance of the RF inductor to decrease. Therefore, in an embodiment of the invention, a shielding structure 30 is also disposed under the inductor 50 to reduce or cut off the eddy current and maintain or improve the Q factor.

The inductor 50 of an embodiment of the invention is disposed above the substrate 10. The shielding structure 30 is disposed in the substrate 10. The material of the substrate 10 includes a semiconductor, such as silicon, or a semiconductor compound, such as silicon germanium. The inductor 50 is formed by a conductive material. The inductor 50 may be formed at the same time as an interconnect structure 40 (shown in FIG. 2B, FIG. 3B, FIG. 4A, FIG. 4B, FIG. 5B, FIG. 6B, and FIG. 7B). The shielding structure 30 is disposed in the substrate 10. The size of the shielding structure 30 may be greater than or equal to the size of the inductor 50. The shielding structure 30 may be composed of various materials and may also have various shapes. For example, the shielding structure 30 may include a high-k dielectric material, a low-k dielectric material, a conductive filling material, or a combination thereof. The high-k dielectric material includes a dielectric material having a dielectric constant greater than 3.9. The low-k dielectric material includes a dielectric material having a dielectric constant less than 3.9. The conductive filling material may include undoped polysilicon. FIG. 1B to FIG. 1G show various units U1, U2, U3, U4, U5, and U6 that form the shielding structure 30.

Figures 1B, 1C, 1D, 1E:
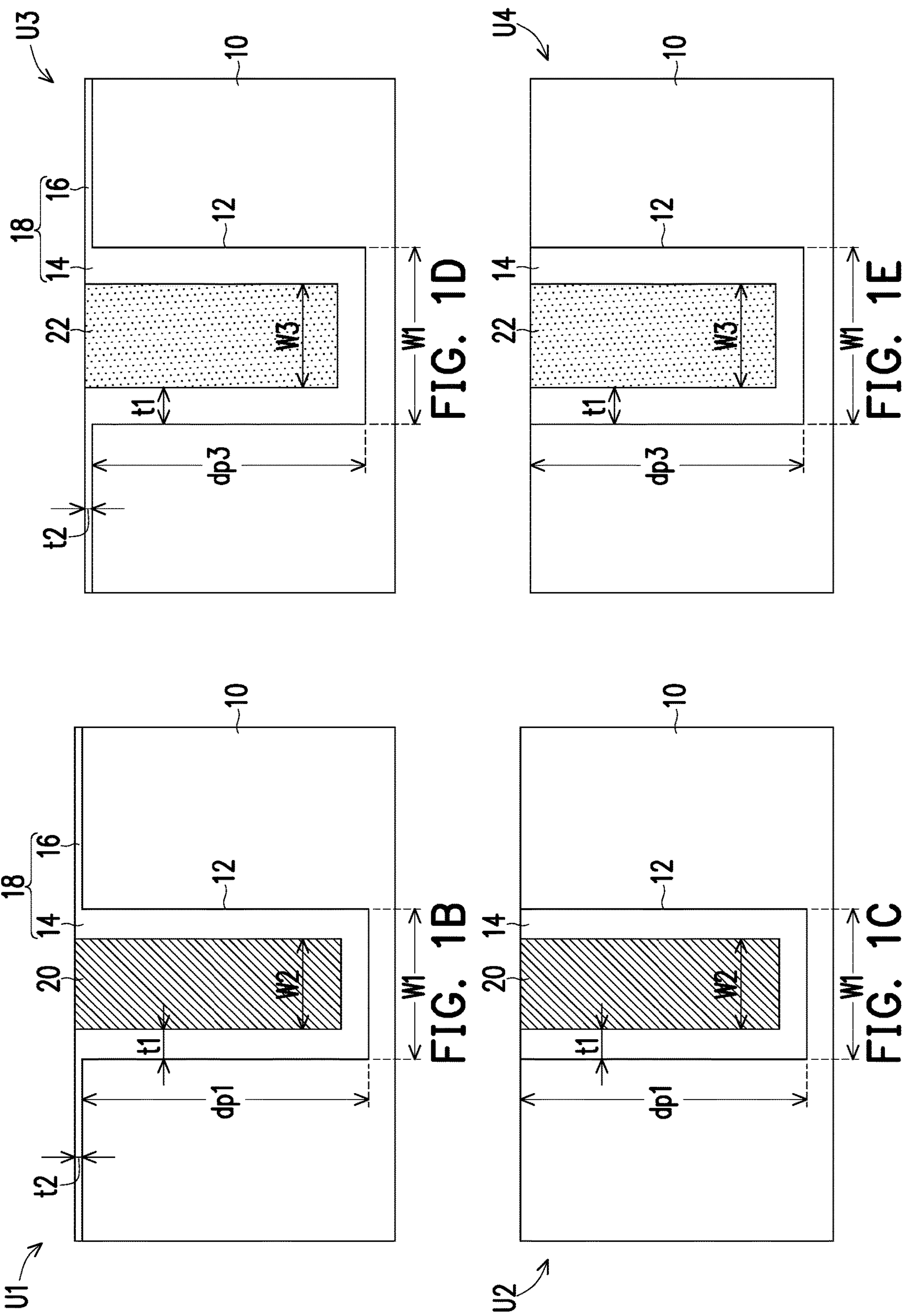
FIG. 1B to FIG. 1G show cross-sectional views of various units of a shielding structure of an embodiment of the invention.

Referring to FIG. 1B, the unit U1 includes high-k dielectric liner layers 14 and 16 and a conductive filling layer 20. The high-k dielectric liner layer 14 and the conductive filling layer 20 are located in a recess 12 of the substrate 10. The high-k dielectric liner layer 16 covers the substrate 10.

The high-k dielectric liner layer 14 is located on the sidewall and the bottom surface of the recess 12 of the substrate 10. The high-k dielectric liner layer 14 is located between the conductive filling layer 20 and the substrate 10. The high-k dielectric liner layer 16 and the high-k dielectric liner layer 14 are connected to form a continuous layer 18. The continuous layer 18 is located on the sidewall and the bottom surface of the recess 12 of the substrate 10 and extended to cover the top surface of the substrate 10. The conductive filling layer 20 is filled in the remaining space of the recess 12. The sidewall and the bottom surface of the conductive filling layer 20 are covered by the high-k dielectric liner layer 14. The top surface of the conductive filling layer 20 may be coplanar with the top surface of the high-k dielectric liner layer 16.

The high-k dielectric liner layers 14 and 16 include dielectric materials having a dielectric constant greater than 3.9, for example, but not limited to, silicon nitride ($Si_3N_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium oxide-aluminum oxide ($HfO_2$—$Al_2O_3$), zirconium oxide ($ZrO_2$). Other suitable high-k dielectric materials are also within the expected scope of the disclosure. The conductive filling layer 20 includes a semiconductor material such as undoped polysilicon, doped polysilicon, or a combination thereof.

In some embodiments, the recess 12 is rectangular, and a width W1 of the recess 12 is, for example, 250 nm to 340 nm. A depth dp1 of the recess 12 is, for example, 6000 nm to 12000 nm. A thickness t1 of the high-k dielectric liner layer 14 and a thickness t2 of the high-k dielectric liner layer 16 may be the same or different. The thicknesses t1 and t2 may be in the range of 20 nm to 50 nm, but larger or smaller thicknesses may also be used. A width W2 of the conductive filling layer 20 is, for example, 150 nm to 300 nm.

Referring to FIG. 1C, the unit U2 is similar to the unit U1. The unit U2 includes the high-k dielectric liner layer 14 and the conductive filling layer 20, but does not include the high-k dielectric liner layer 16. The top surface of the substrate 10 is not covered by the high-k dielectric liner layer 16. The top surface of the conductive filling layer 20 may be coplanar with the top surface of the high-k dielectric liner layer 16 and the top surface of the substrate 10. The materials of the high-k dielectric liner layer 14 and the conductive filling layer 20 are as described above and are not described again.

Referring to FIG. 1D, the unit U3 is similar to the unit U1. The unit U3 includes the high-k dielectric liner layers 14 and 16 and a dielectric layer 22. In other words, the dielectric layer 22 of the unit U3 replaces the conductive filling layer 20 of the unit U1. The high-k dielectric liner layer 14 and the dielectric layer 22 are completely filled in the recess 12 of the substrate 10. The high-k dielectric liner layer 16 covers the substrate 10. The dielectric layer 22 is filled in the remaining space of the recess 12. The sidewall and the bottom surface of the dielectric layer 22 are covered by the high-k dielectric liner layer 14. The top surface of the dielectric layer 22 may be coplanar with the top surfaces of the high-k dielectric liner layers 14 and 16. In some other embodiments, the dielectric layer 22 may also be a portion (shown in FIG. 4A and FIG. 4B) of a dielectric layer 32 of the upper interconnect structure 40. This portion is extended continuously from the top of the substrate 10 to the recess 12, which is described in detail later.

The materials and the thickness of the high-k dielectric liner layers 14 and 16 are as described in the above embodiments and are not described again here. The dielectric constant of the dielectric layer 22 may be less than or equal to the dielectric constant of the high-k dielectric liner layer 14. The dielectric layer 22 is, for example, silicon oxide ($SiO_2$), silicon oxynitride (SiON), silicon nitride ($Si_3N_4$), a low-k material, or a combination thereof. The low-k material includes a dielectric material having a dielectric constant less than or equal to 3.9. The low-k material includes fluorine-doped silica glass (FSG); silicon sesquioxide such as hydrogen silsesquioxnane (HSQ), methyl silsesquioxane (MSQ), and hybrid-organo siloxane polymer (HOSP); aromatic hydrocarbon such as SiLK; organosilicate glass such as carbon black (black diamond, BD), 3MS, 4MS; parylene; fluoro-polymer such as PFCB, CYTOP, Teflon; poly(arylether) such as PAE-2, FLARE; porous polymer such as XLK, nanofoam, aerogel; coral, etc. Other suitable low-k dielectric materials are also within the expected scope of the disclosure. In some embodiments, the recess 12 is rectangular, and the width W1 of the recess 12 is, for example, 250 nm to 340 nm. The depth dp1 of the recess 12 is, for example, 6000 nm to 12000 nm. The thickness t1 of the high-k dielectric liner layer 14 and the thickness t2 of the high-k dielectric liner layer 16 may be the same or different. The thicknesses t1 and t2 may be in the range of 20 nm to 50 nm, but larger or smaller thicknesses may also be used. A width W3 of the dielectric layer 22 is, for example, 150 nm to 300 nm. A depth dp3 of the recess 12 is, for example, 6000 nm to 12000 nm.

Referring to FIG. 1E, the unit U4 is similar to the unit U3. The unit U4 includes the high-k dielectric liner layer 14 and the dielectric layer 22, but does not include the high-k dielectric liner layer 16. The top surface of the substrate 10 is not covered by the high-k dielectric liner layer 16. The top surface of the dielectric layer 22 may be coplanar with the top surface of the high-k dielectric liner layer 16 and the top surface of the substrate 10. In some other embodiments, the dielectric layer 22 may also be a portion of the dielectric layer of the upper interconnect structure. The materials of the high-k dielectric liner layer 14 and the dielectric layer 22 are as described above and are not described again.

Figures 1F, 1G:
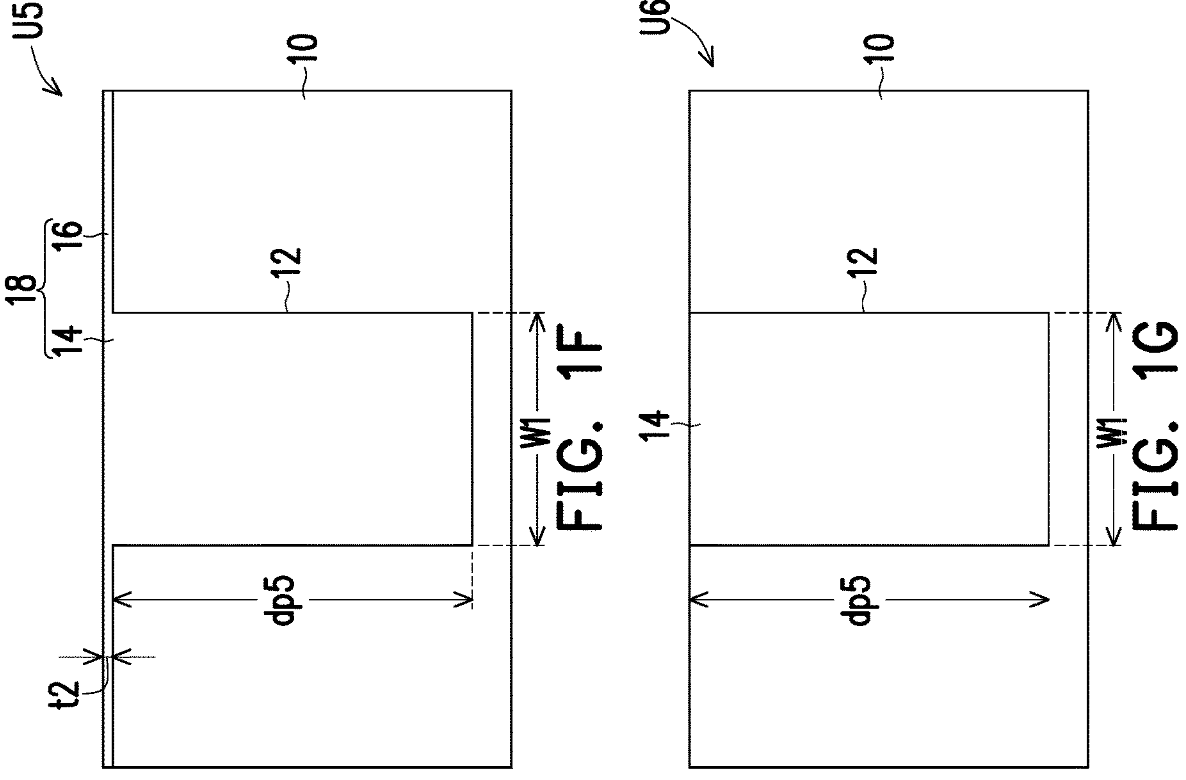

Referring to FIG. 1F, the unit U5 is similar to the unit U3. The unit U5 includes the high-k dielectric liner layers 14 and 16 but does not include the dielectric layer 22. The recess 12 of the substrate 10 is completely filled by the high-k dielectric liner layer 14. The materials of the high-k dielectric liner layers 14 and 16 are as described above and are not described again. In some embodiments, the recess 12 is rectangular, and the width W1 of the recess 12 is, for example, 250 nm to 340 nm. A depth dp5 of the recess 12 is, for example, 6000 nm to 12000 nm.

Referring to FIG. 1G, the unit U6 is similar to the unit U5. The unit U6 includes the high-k dielectric liner layer 14, but does not include the high-k dielectric liner layer 16. The top surface of the substrate 10 is not covered by high-k dielectric liner layer 16. The material of the high-k dielectric liner layer 14 is as described above and is not described again.

The top view of the units U1, U2, U3, U4, U5, and U6 may have various shapes, for example, rectangle (or strip shape), square, L shape, or a combination thereof, as shown in FIG. 2A, FIG. 3A, FIG. 5A, FIG. 6A, and FIG. 7A. Referring to FIG. 1A to FIG. 1G, the shielding structure 30 of an embodiment of the invention may be formed by one of the units U1, U2, U3, U4, U5, U6, or a combination thereof. In other words, the shielding structure 30 may be composed of the same unit, or composed of two or a plurality of different units. Therefore, the shapes of the recesses 12 of the plurality of units (U1, U2, U3, U4, U5, and/or U6) forming the shielding structure 30 may be the same or different. The shape of the recesses 12 is, for example, rectangle (or strip shape), square, L shape, or a combination thereof. The lengths, widths, or depths of the recesses 12 may be the same or different. The distance between the recesses 12 may be the same or different. The density of the recesses 12 of different regions may be the same or different. The recesses 12 may be completely overlapped, partially overlapped, or not overlapped with the inductor 50. Some embodiments are given below for illustration. However, the embodiments of the invention are not limited thereto.

FIG. 2A, FIG. 3A, FIG. 5A, FIG. 6A, and FIG. 7A show top views of semiconductor devices including various shielding structures 30 and inductors 50. FIG. 2B, FIG. 3B, FIG. 4A, FIG. 4B, FIG. 5B, FIG. 6B, and FIG. 7B show cross-sectional views of semiconductor devices including various shielding structures 30 and inductors 50. FIG. 2B, FIG. 3B, FIG. 5B, FIG. 6B, and FIG. 7B are cross-sectional views of line I-I' of FIG. 2A, FIG. 3A, FIG. 5A, FIG. 6A, and FIG. 7A respectively.

Figure 2A:
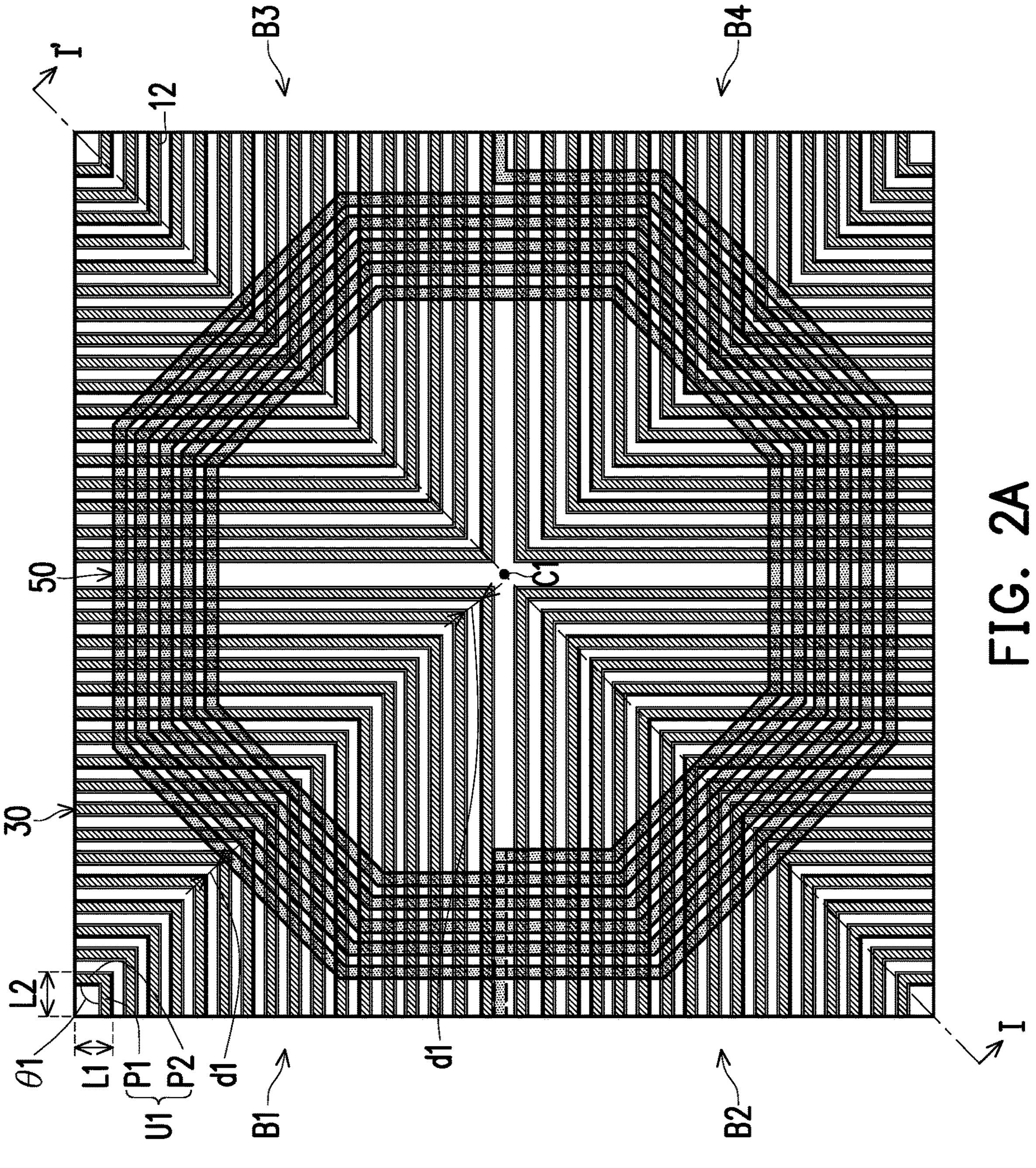
FIG. 2A and FIG. 2B are top views and cross-sectional views of a semiconductor device according to an embodiment of the invention.
Figure 2B:
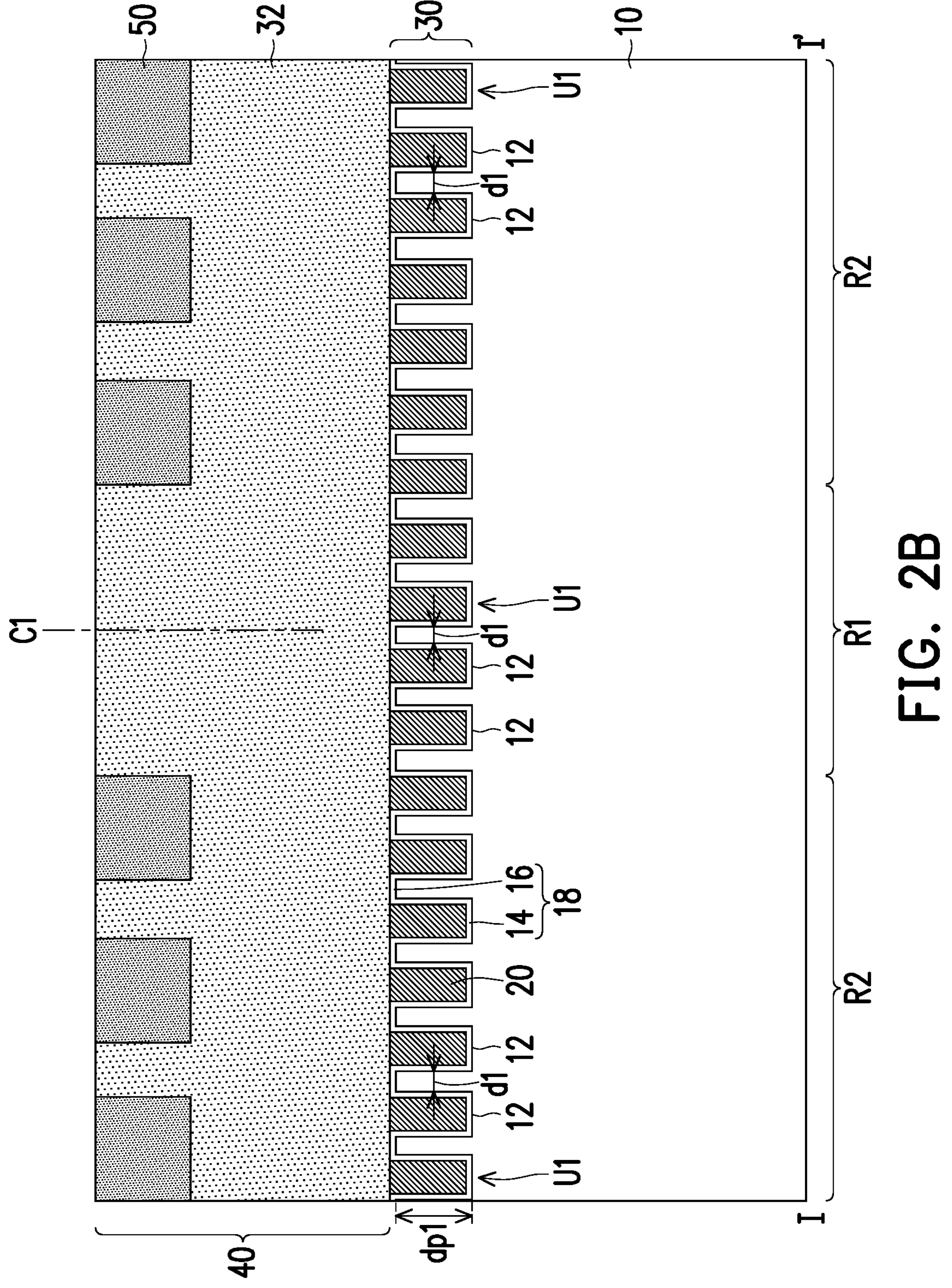

Referring to FIG. 2A and FIG. 2B, the inductor 50 is disposed in the interconnect structure 40 above the substrate 10. The inductor 50 may be disposed at the same height as any conductor layer of the interconnect structure 40, for example, a first conductor layer, a second conductor layer, a third conductor layer, a fourth conductor layer, or a higher conductor layer. The inductor 50 is separated from the substrate 10 by the dielectric layer 32. The dielectric layer 32 may be a single layer or a plurality of layers. The shielding structure 30 is disposed in the substrate 10 and covered by the dielectric layer 32. The shielding structure 30 is formed by arranging a plurality of identical units U1. The units U1 (or the recesses 12) may or may not be partially overlapped with the inductor 50. The conductive filling layers 20 of the plurality of units U1 may be electrically connected to each other and grounded, as shown in FIG. 2B.

Referring to FIG. 2A, the unit U1 may include a first portion P1 and a second portion P2. The first portion P1 and the second portion P2 are connected to each other. The top view of the unit U1 formed by the first portion P1 and the second portion P2 is a rectangle or a strip shape. In FIG. 2A, an included angle θ1 between the first portion P1 and the second portion P2 of the unit U1 is a right angle (90 degrees), and the top view of the unit U1 is an L shape. However, the included angle θ1 is not limited thereto. In other embodiments, the included angle θ1 between the first portion P1 and the second portion P2 may also be an acute angle or an obtuse angle. A plurality of units U1 are arranged from four corners toward a central axis (or center) C1 of the inductor 50. A length L1 of a plurality of first portions P1 and a length L2 of a plurality of second portions P2 are gradually increased from the four corners toward the central axis C1 of the inductor 50. The plurality of units U1 may be arranged into four blocks B1, B2, B3, and B4. The four blocks B1, B2, B3, and B4 may be symmetrical to each other, but are not limited thereto.

Referring to FIG. 2B, the plurality of units U1 have the same depth dp1, but are not limited thereto. In other embodiments, the plurality of units U1 may also have different depths dp1. For example, the depth dp1 of the unit U1 close to the central axis C1 of the inductor 50 is greater, and the depth dp1 of the unit U1 far away from the central axis C1 of the inductor 50 is less.

In the present embodiment, a distance d1 between two recesses 12 of two adjacent units U1 is the same. The distance d1 between two recesses 12 of two adjacent units U1 in a central region R1 close to the central axis C1 is equal to the distance d1 between two recesses 12 of two adjacent units U1 in a peripheral region R2 far away from the central axis C1. In other words, the density of the recesses 12 of the central region R1 is equal to the density of the recesses 12 of the peripheral region R2. However, the invention is not limited thereto.

Figure 3A:
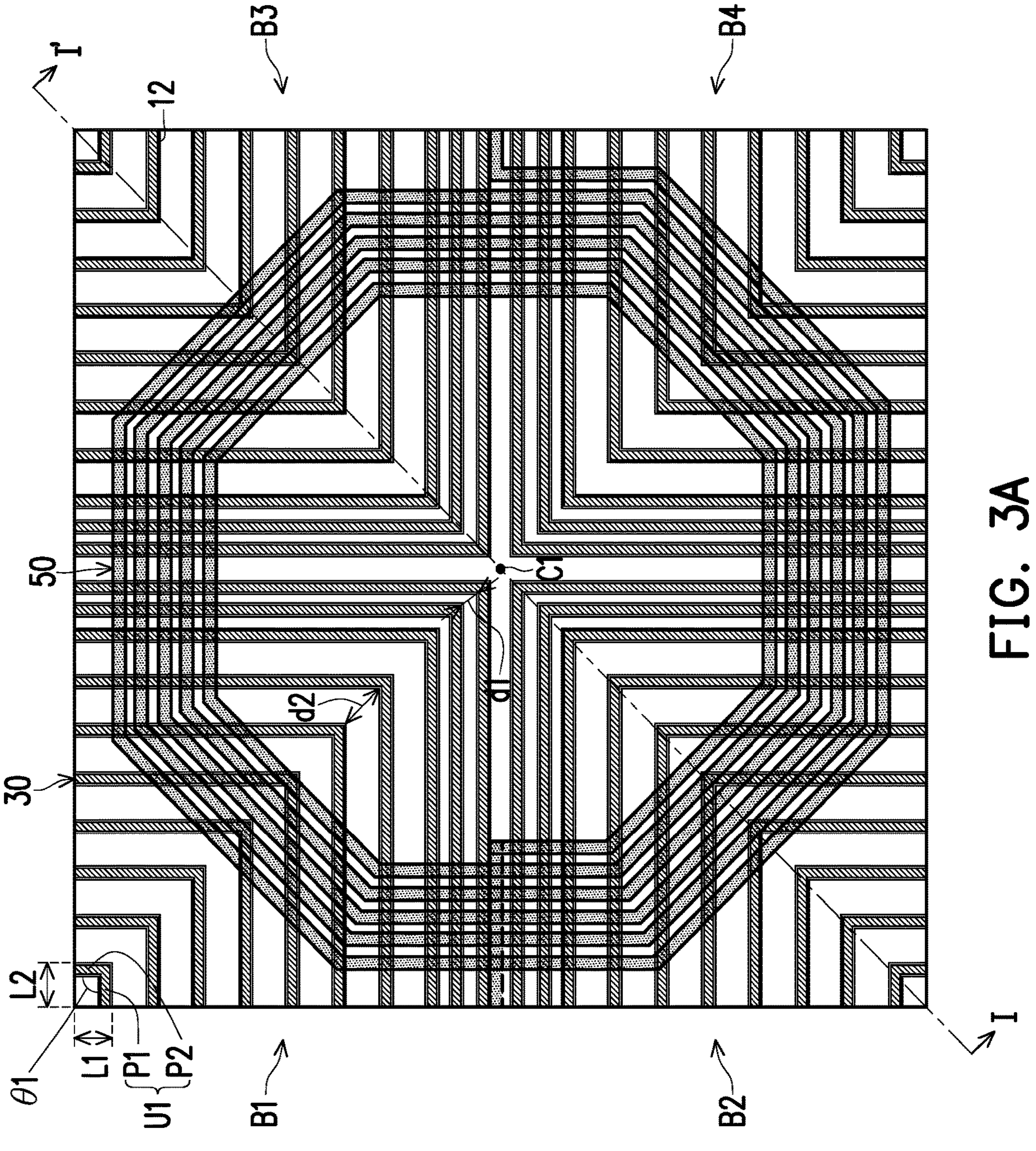
FIG. 3A and FIG. 3B are top views and cross-sectional views of a semiconductor device according to another embodiment of the invention.
Figure 3B:
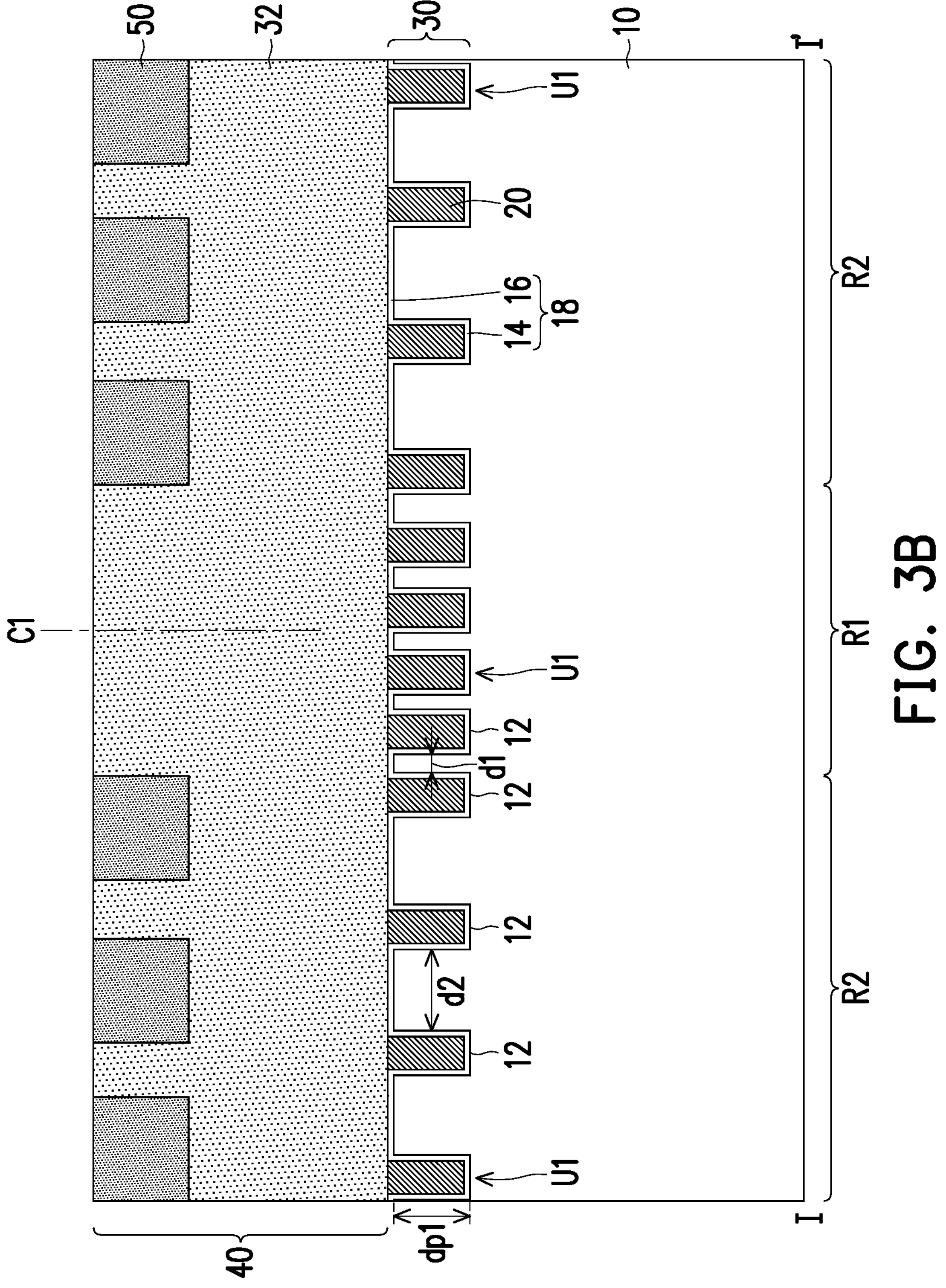

Referring to FIG. 3A and FIG. 3B, in some other embodiments, the distance d1 between two recesses 12 of two adjacent units U1 in the central region R1 is the same, and a distance d2 between two recesses 12 of two adjacent units U1 in the peripheral region R2 far away from the central axis C1 is the same. The distance d1 and the distance d2 are not equal. The density of the recesses 12 of the central region R1 is not equal to the density of the recesses 12 of the peripheral region R2. In some embodiments, the distance d2 is greater than the distance d1. The distance d2 may be 1.2 times to 5 times the distance d1. In other words, the density of the recesses 12 of the central region R1 is greater than the density of the recesses 12 of the peripheral region R2. The high density of the units U1 of the central region R1 may effectively reduce the eddy current of the central region R1. The density reduction of the units U1 of the peripheral region R2 may reduce the pattern density and reduce the burden of the manufacturing process. In addition, in FIG. 3A, the distance d1 between two adjacent units U1 may be less than or equal to the distance d2 between the two adjacent units U1.

In the shielding structure 30 shown in FIG. 2B and FIG. 3B, the plurality of high-k dielectric liner layers 16 of the units U1 may be connected to each other to form a continuous layer 18 with the plurality of high-k dielectric liner layers 14. This continuous layer 18 separates the dielectric layer 32 from the substrate 10. In other embodiments, the shielding structure 30 may also not include the plurality of high-k dielectric liner layers 16, but may be formed by a plurality of units U2 (FIG. 1C) (not shown), so that the substrate 10 between two adjacent units U2 is in direct contact with the dielectric layer 32.

Figure 4A:
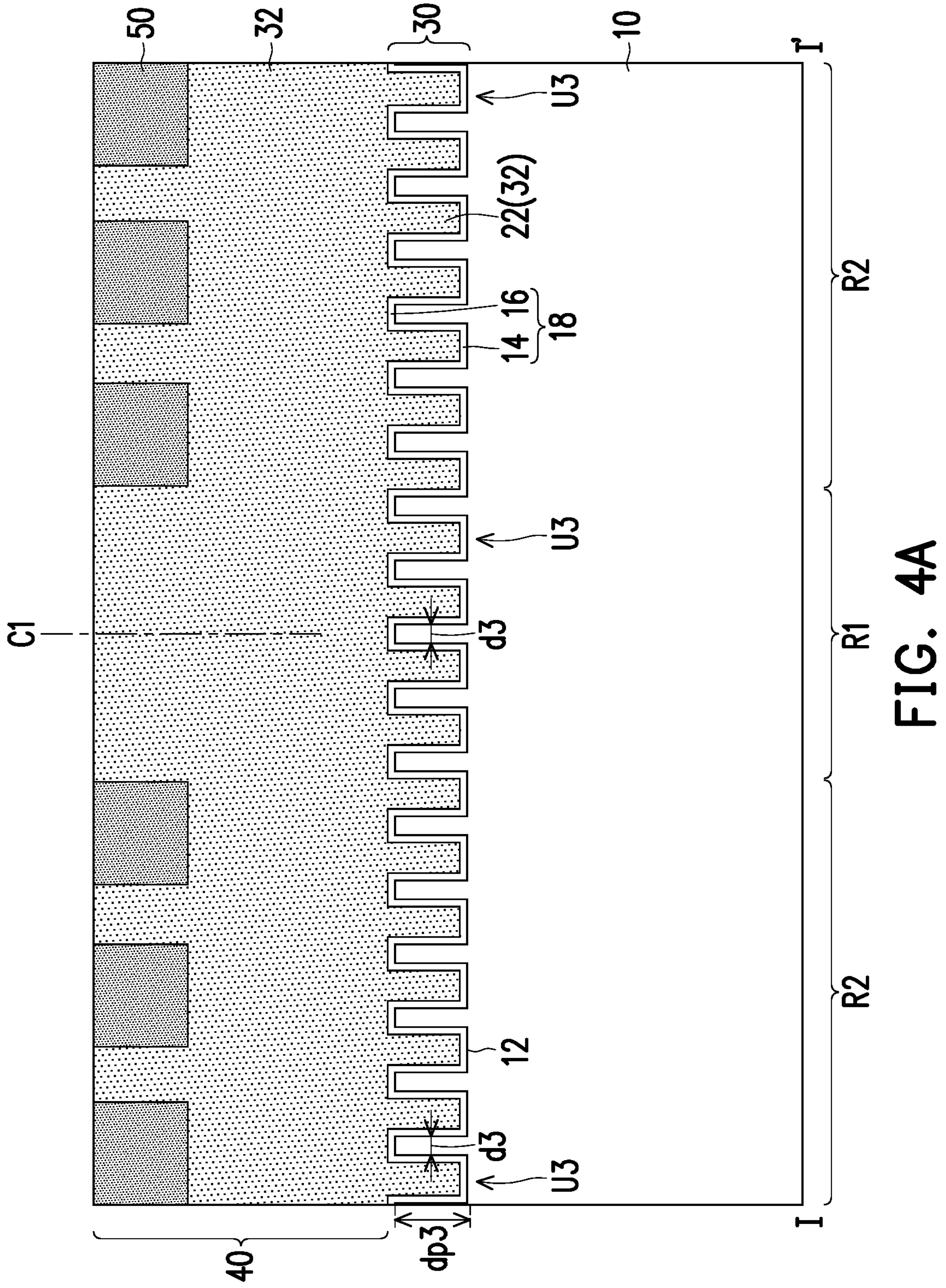
FIG. 4A and FIG. 4B are cross-sectional views of a semiconductor device according to some other embodiments of the invention.

Referring to FIG. 4A, the shielding structure 30 is formed by arranging a plurality of identical units U3. The top view of the recesses 12 of the units U3 may be rectangular or square. When the recesses 12 of the units U3 are rectangular or square, the depth dp3 may be, for example, 6000 nm to 12000 nm. When the recesses 12 of the units U3 are square in the top view, the width of the square is, for example, 320 nm to 640 nm. The wider the width of the square, the deeper the depth dp3 may be. In the present embodiment, the dielectric layer 22 of the shielding structure 30 is a portion of the dielectric layer 32 of the interconnect structure 40. In other words, after the high-k dielectric liner layers 14 and 16 are formed on the recesses 12 and the substrate 10, a deposition process of the dielectric layer 32 of the interconnect structure 40 is performed, so that the dielectric layer 32 may be formed above the substrate 10 and filled in the recesses 12 to serve as the dielectric layer 22 of the shielding structure 30. Therefore, in the present embodiment, there is no interface between the dielectric layers 22 and 32.

A distance d3 between two recesses 12 of two adjacent units U3 is the same. In other words, the distance d3 between two recesses 12 of two adjacent units U3 in the central region R1 close to the central axis C1 is equal to the distance d3 between two recesses 12 of two adjacent units U3 in the peripheral region R2 far away from the central axis C1. However, the invention is not limited thereto. In some other embodiments, the distance d3 between two recesses 12 of two adjacent units U3 in the central region R1 is not equal to the distance d3 between two recesses 12 of two adjacent units U3 in the peripheral region R2 far away from the central axis C1. For example, the distance d3 between two recesses 12 of two adjacent units U3 in the central region R1 is less than the distance d3 between two recesses 12 of two adjacent units U3 in the peripheral region R2 far away from the central axis C1.

In FIG. 4A, the depth dp3 of the plurality of units U3 of the shielding structure 30 is the same. However, the embodiments of the invention are not limited thereto. In other examples, referring to FIG. 4B, the shielding structure 30 includes a plurality of units U3*a* and U3*b*. The unit U3*a* is located at the central region R1, and the unit U3*b* is located at the peripheral region R2. The top view of recesses 12*a* of the unit U3*a* and recesses 12*b* of the unit U3*b* may be rectangular or square. When the top view of the recesses 12*a* and the recesses 12*b* is square, the width of the square is, for example, 320 nm to 640 nm. The wider the width of the square, the deeper depths dp3*a* and dp3*b* may be. The recesses 12*a* of the unit U3*a* have the same depth dp3*a*. The recesses 12*b* of the unit U3*b* have the same depth dp3*b*. The depth dp3*a* is greater than the depth dp3*b*. The depth dp3*a* is 1.2 times to 6 times the depth dp3*b*. When the recesses 12*a* and the recesses 12*b* are rectangular or square, the depth dp3*a* may be, for example, 2400 nm to 12000 nm, and the depth dp3*b* may be, for example, 2000 nm to 9000 nm. The predetermined dielectric constant (permittivity) may be obtained by adjusting the depths dp3*a* and dp3*b* of the recesses 12*a* and 12*b*.

Figure 4B:
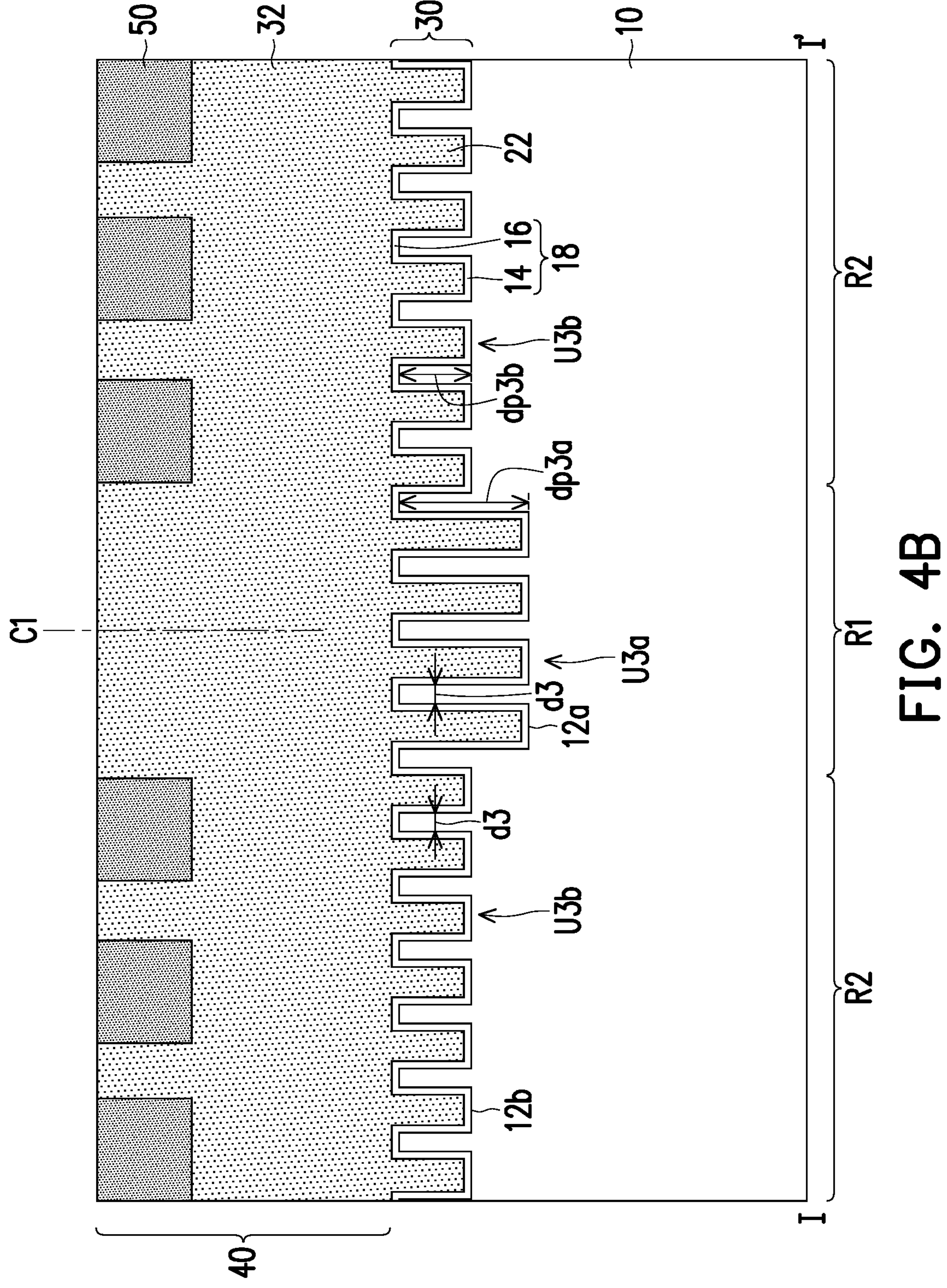

In other embodiments, the shielding structure 30 of FIG. 4A and FIG. 4B may also include or not include the plurality of high-k dielectric liner layers 16, but may instead be formed by a plurality of units U4 (FIG. 1D) (not shown). The substrate 10 between two adjacent units U2 is in direct contact with the dielectric layer 32. The shielding structure 30 of a subsequent embodiment may also not include the plurality of high-k dielectric liner layers 16, which is not described in detail hereafter. Furthermore, the top view of the shielding structure 30 of FIG. 4A and FIG. 4B may be similar to FIG. 2A or FIG. 3A, or may be as shown in FIG. 5A or FIG. 6A described later.

Figure 5A:
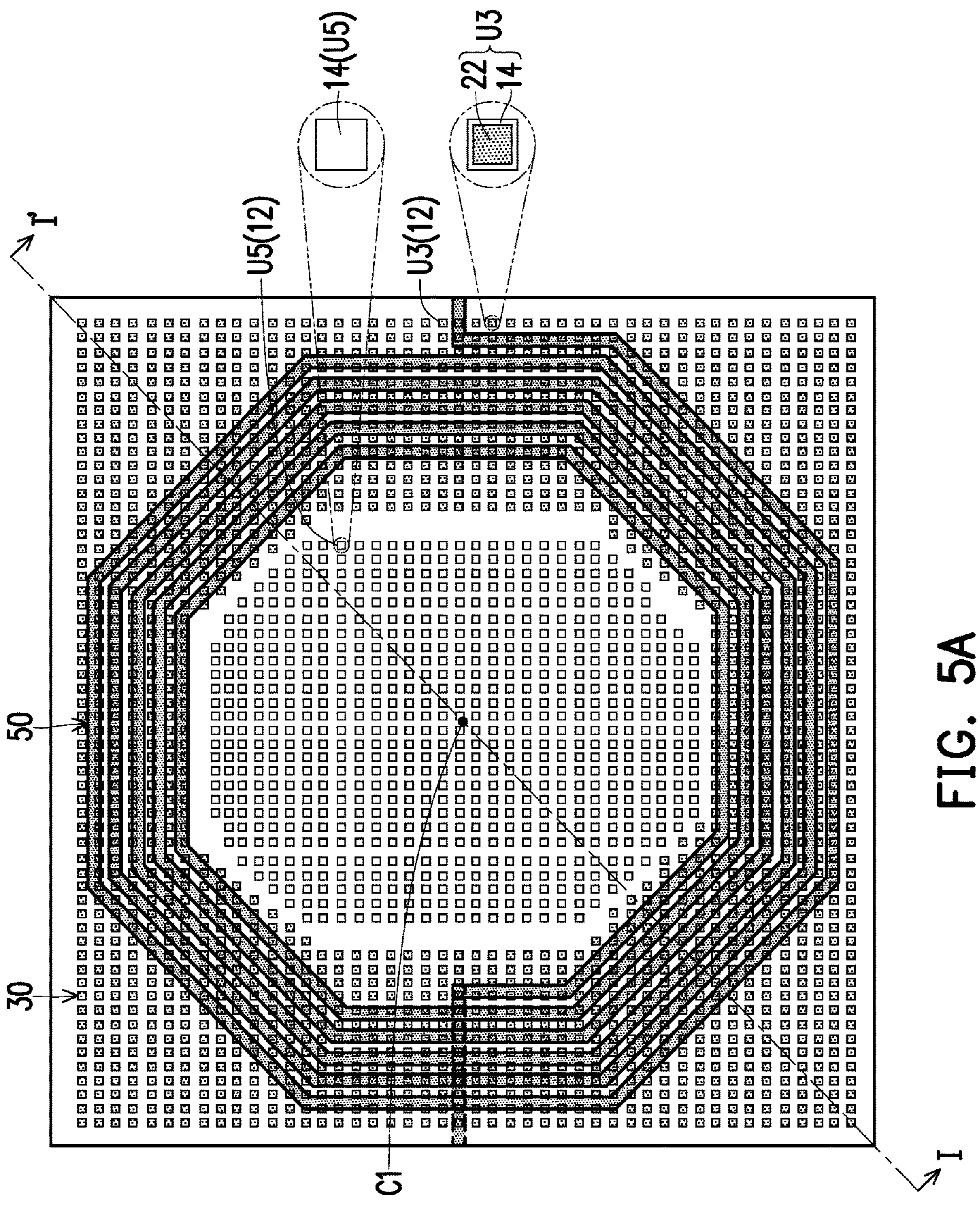
FIG. 5A and FIG. 5B are top views and cross-sectional views of a semiconductor device according to another embodiment of the invention.
Figure 5B:
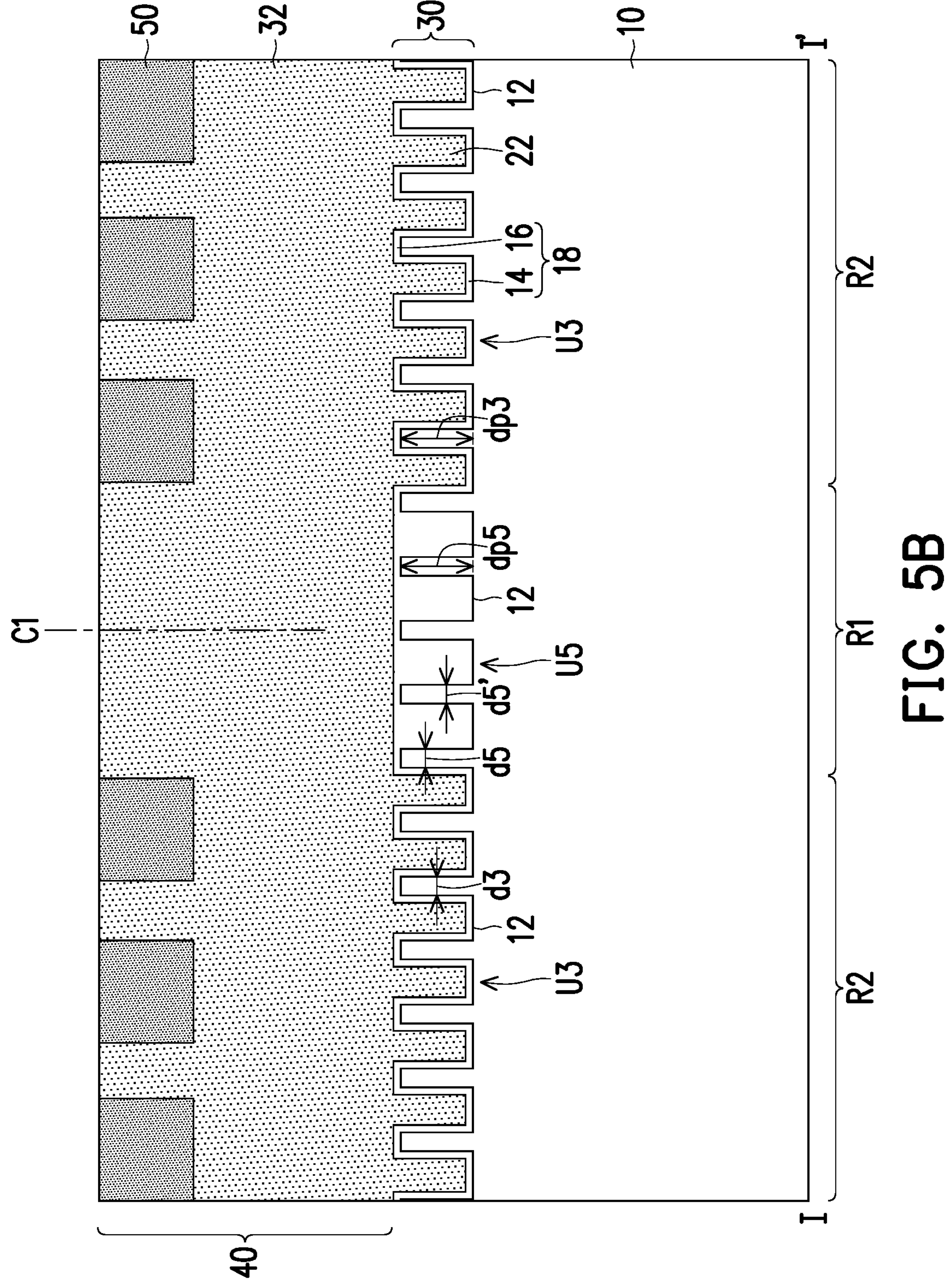
Figure 6A:
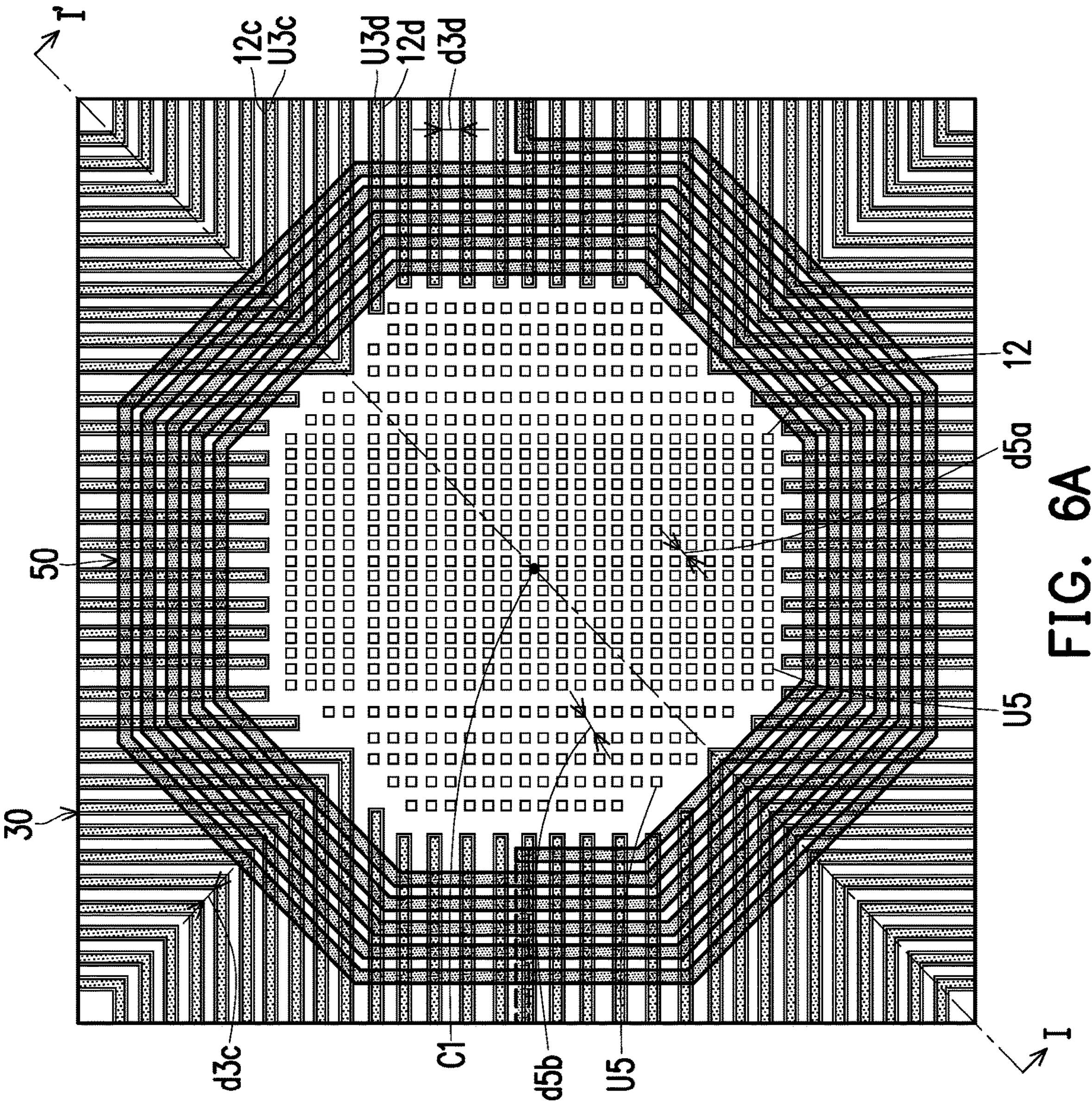
FIG. 6A and FIG. 6B are top views and cross-sectional views of a semiconductor device according to another embodiment of the invention.

Referring to FIG. 5A and FIG. 5B, the shielding structure 30 is formed by the units U3 and U5. The unit U5 is located at the central region R1, and the unit U3 is located at the peripheral region R2. The unit U5 (or the recess 12 thereof) of the central region R1 is not overlapped with the inductor 50. The unit U3 (or the recess 12 thereof) of the peripheral region R2 is overlapped, partially overlapped, or not overlapped with the inductor 50.

Referring to FIG. 5B, the recesses 12 of the unit U3 have the same depth dp3 and the same distance d3. The recesses 12 of the unit U5 have the same depth dp5 and a same distance d5. In the present embodiment, the depth dp3 is equal to the depth dp5, and the distance d3 is equal to the distance d5. However, the embodiments of the invention are not limited thereto. The depth dp3 may be greater than the depth dp5. The distance d5 may be greater than the distance d3. A distance d5' between the adjacent unit U5 and unit U3 may be greater than, equal to, or less than the distance d5 or d3. In other embodiments, in the central region R1, a distance d5*a* between the units U5 closer to the central axis C1 is different from a distance d5*b* between the units U5 farther away from the central axis C1, as shown in FIG. 6A.

Referring to FIG. 5A, the units U3 and U5 of the shielding structure 30 have the same shape, for example, both are square in the top view. Viewed from the top view, the units U3 and U5 have the same size and area. However, the embodiments of the invention are not limited thereto. In other embodiments, the units U3 and U5 may also have different sizes and areas (not shown). In other embodiments, the units U3 (U3*c* and U3*d*) and U5 may have different shapes, as shown in FIG. 6A.

Figure 6B:
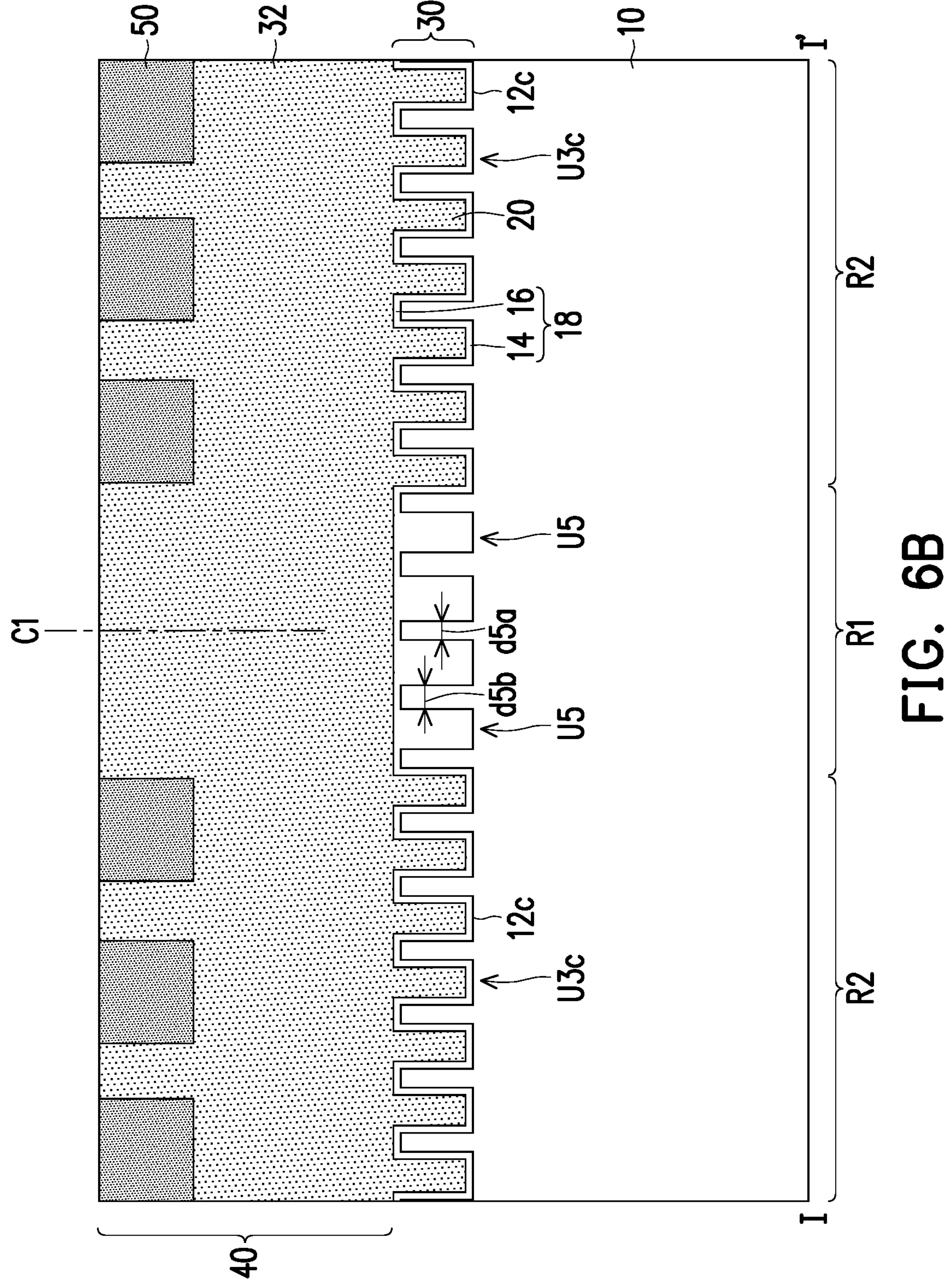

Referring to FIG. 6A and FIG. 6B, the shielding structure 30 includes the units U5 and U3. The unit U5 is disposed at the central region R1, and the unit U3 is disposed at the peripheral region R2. The units U5 and U3 have different shapes. The top view of the recess 12 of the unit U5 is, for example, square. The unit U3 includes the units U3*c* and U3*d*. The unit U3*c* is disposed at a corner. The unit U3*d* is disposed between two units U3*c*. A recess 12*c* of the unit U3*c* has a different shape from the top view than a recess 12*d* of the unit U3*d*. In the present embodiment, the top view of the unit U3*c* is an L shape, and the top view of the unit U3*d* is an I shape. The unit U5 (or the recess 12 thereof) is not overlapped with the inductor 50. The units U3*c* and U3*d* (or the recesses 12 thereof) are partially overlapped or not overlapped with the inductor 50.

In the present embodiment, in the central region R1, the distance d5*a* between the units U5 closer to the central axis C1 is less than the distance d5*b* between the units U5 farther away from the central axis C1. However, the embodiments of the invention are not limited thereto. There may be a single distance, or three or more different distances, between the units U5 in the central region R1.

A distance d3*c* between the units U3*c* may be the same. A distance d3*d* between the units U3*d* may be the same. The distance d3*c* may be equal to, less than, or greater than the distance d3*d*. In other examples, the distance d3*c* (not shown) between the units U3*c* may be different. The distance d3*d* (not shown) between the units U3*d* may be different.

Figure 7A:
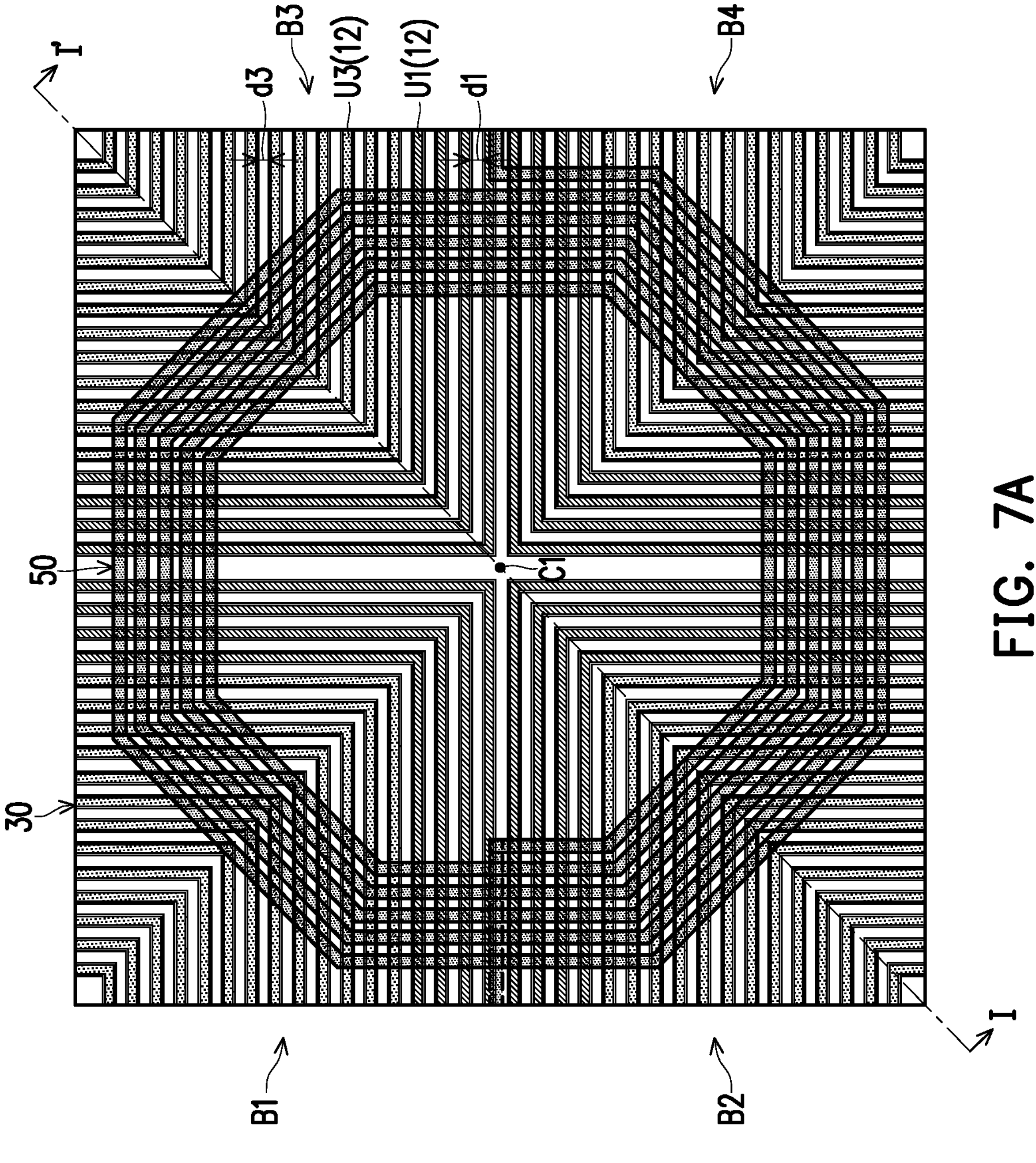
FIG. 7A and FIG. 7B are top views and cross-sectional views of a semiconductor device according to another embodiment of the invention.
Figure 7B:
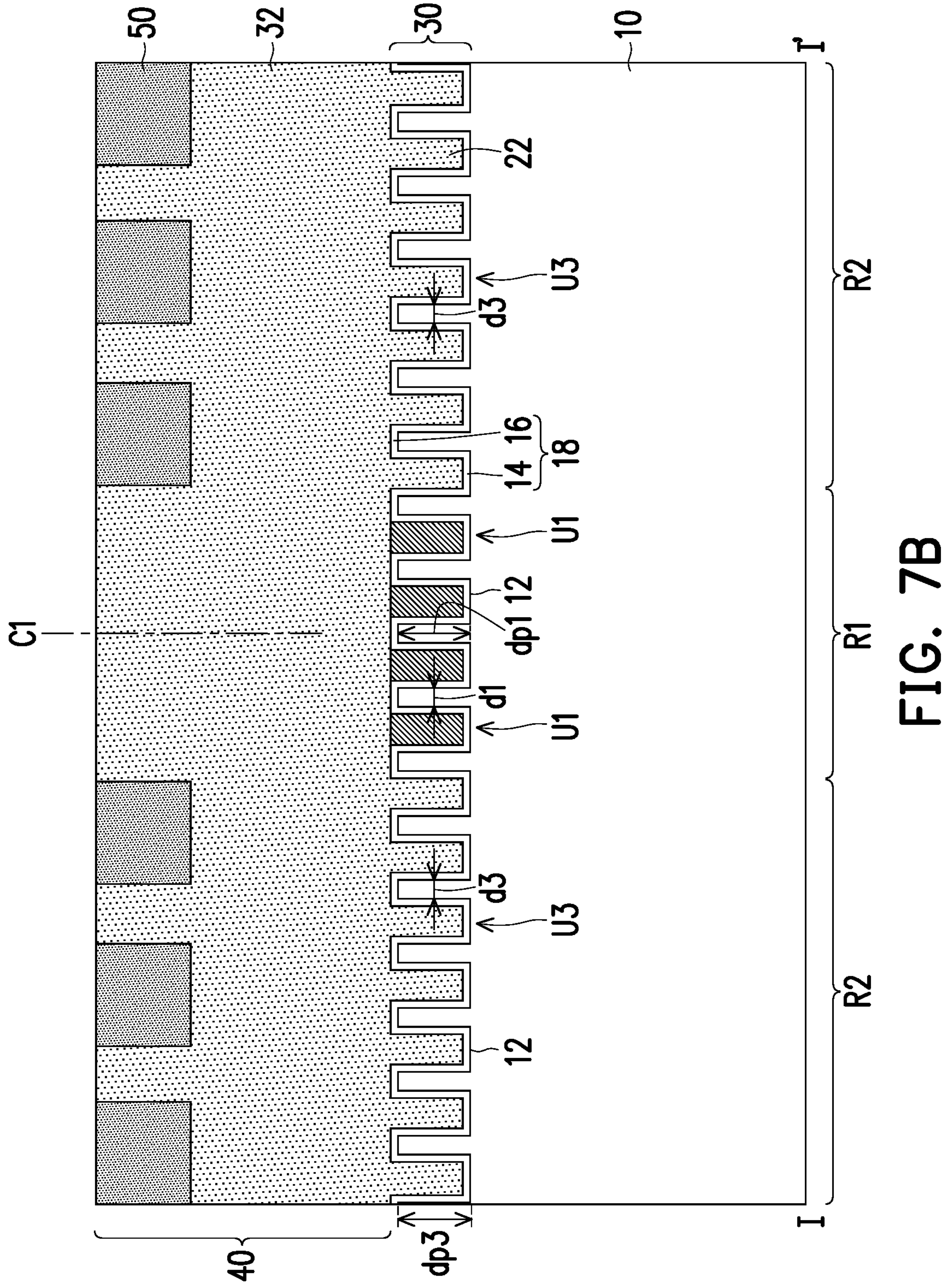

Referring to FIG. 7A and FIG. 7B, the shielding structure 30 includes the units U1 and U3. The unit U1 is disposed at the central region R1 and extended to the peripheral region R2, and the unit U3 is disposed outside the unit U1. The conductive filling layers 20 of the plurality of units U1 may be electrically connected to each other and may be grounded, as shown in FIG. 7B. The units U1 and U3 have the same shape, for example, both are L shape in the top view, as shown in FIG. 7A. The unit U1 (or the recess 12 thereof) is partially overlapped with the inductor 50. The unit U3 (or the recess 12 thereof) is partially overlapped or not overlapped with the inductor 50.

In the present embodiment, the distance d1 between the units U1 is the same, and the distance d3 between the units U3 is the same. The distance d1 may be less than or equal to the distance d3. In other examples, the distance d1 between the units U1 may also be different, and the distance d3 (not shown) between the units U3 is different. The depth dp1 of the recess 12 of the unit U1 may be equal to or greater than the depth dp3 of the recess 12 of the unit U3.

Based on the above, in some embodiments of the invention, the shielding structure disposed under the inductor has a high-k dielectric material so that the eddy current generated by the magnetic field in the inductor region during the operation of the inductor may be cut off or reduced. Therefore, the Q factor may be increased, thereby improving the performance of the inductor. Moreover, in the invention, the shielding structure disposed under the inductor has a dielectric material having a high dielectric constant to produce a higher capacitance to ground, and therefore a lower self-resonant frequency may be achieved.

Moreover, in some other embodiments of the invention, the shielding structure disposed under the inductor has a low dielectric constant material so that the eddy current generated by the magnetic field in the inductor region during the operation of the inductor may be cut off or reduced. Therefore, the Q factor may be increased, thereby improving the performance of the inductor. Moreover, in the invention, the shielding structure disposed under the inductor has a dielectric material having a low dielectric constant to produce a lower capacitance to ground, and therefore a higher self-resonant frequency may be achieved.

In some other embodiments of the invention, the shielding structure disposed under the inductor has the conductive filling layer, so that the eddy current generated by the magnetic field in the inductor region during the operation of the inductor may be cut off or reduced. Therefore, the Q factor may be increased, thereby improving the performance of the inductor. Moreover, in the invention, the shielding structure disposed under the inductor has the conductive filling layer to produce a higher capacitance to ground, and therefore a lower self-resonant frequency may be achieved.

What is claimed is:

1. A semiconductor device, comprising:
- a substrate;
- a shielding structure disposed in the substrate, comprising:
  - a plurality of conductive filling layers in a plurality of recesses of the substrate;
  - a plurality of high-k dielectric liner layers between the plurality of conductive filling layers and the substrate, wherein the plurality of conductive filling layers are electrically connected to each other and grounded; and
  - an inductor located above the shielding structure.

2. The semiconductor device of claim 1, wherein the plurality of high-k dielectric liner layers are also extended to cover a surface of the substrate between the plurality of recesses to form a continuous layer.

3. The semiconductor device of claim 1, wherein the plurality of recesses are at equal distances from each other.

4. The semiconductor device of claim 1, wherein the plurality of recesses comprise:
- a plurality of first recesses; and
- a plurality of second recesses outside the plurality of first recesses, wherein the plurality of first recesses are closer to a center of the inductor than the plurality of second recesses.

5. The semiconductor device of claim 1, wherein a second distance between the plurality of second recesses is greater than a first distance between the plurality of first recesses.

6. The semiconductor device of claim 1, wherein a density of the plurality of second recesses is less than a density of the plurality of first recesses.

7. The semiconductor device of claim 1, wherein a shape of the plurality of recesses comprises an L shape.

8. The semiconductor device of claim 7, wherein the plurality of high-k dielectric liner layers are also extended to cover a surface of the substrate between the plurality of recesses to form a continuous layer.

9. The semiconductor device of claim 7, wherein the plurality of recesses are at equal distances from each other.

10. The semiconductor device of claim 7, wherein a shape of the plurality of recesses comprises a square, a rectangle, a L shape, or a combination thereof.

11. The semiconductor device of claim 7, wherein the plurality of recesses comprise:
- a plurality of first recesses; and
- a plurality of second recesses outside the plurality of first recesses.

12. The semiconductor device of claim 11, wherein the plurality of first recesses are not overlapped with the inductor, and the plurality of second recesses are overlapped with the inductor.

13. The semiconductor device of claim 11, wherein a first depth of the plurality of first recesses is greater than a second depth of the plurality of second recesses.

14. The semiconductor device of claim 11, wherein the plurality of first recesses and second recesses comprise different materials.

15. The semiconductor device of claim 14, wherein the plurality of first recesses are completely filled by the plurality of high-k dielectric liner layers, and the plurality of second recesses are completely filled by the plurality of high-k dielectric liner layers and the dielectric layer.

16. The semiconductor device of claim 15, wherein a shape of the plurality of first recesses is the same as a shape of the plurality of second recesses.

17. The semiconductor device of claim 15, wherein a shape of the plurality of first recesses is different from a shape of the plurality of second recesses.

18. The semiconductor device of claim 17, wherein a shape of the plurality of first recesses comprises a square, and a shape of the plurality of second recesses comprises a strip shape and an L-shape.

19. The semiconductor device of claim 14, wherein the plurality of first recesses are completely filled by the plurality of high-k dielectric liner layers and a plurality of conductive filling layers, and the plurality of second recesses are completely filled by the plurality of high-k dielectric liner layers and the dielectric layer, wherein the plurality of conductive filling layers are electrically connected to each other and grounded.

20. A semiconductor device, comprising:
- a substrate;
- a shielding structure disposed in the substrate, comprising: a plurality of high-k dielectric liner layers in a plurality of recesses of the substrate, and at least a portion of the plurality of high-k dielectric liner layers does not completely fill the plurality of recesses;
- an inductor located above the shielding structure; and
- a dielectric layer located between the inductor and the shielding structure and filled in a plurality of remaining spaces of the plurality of recesses.

* * * * *